United States Patent
Wang et al.

(10) Patent No.: US 9,589,991 B2
(45) Date of Patent: Mar. 7, 2017

(54) THIN-FILM TRANSISTOR, MANUFACTURING METHOD THEREOF, DISPLAY SUBSTRATE AND DISPLAY DEVICE

(71) Applicant: BOE Technology Group Co., Ltd., Beijing (CN)

(72) Inventors: Zuqiang Wang, Beijing (CN); Chien Hung Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/769,180

(22) PCT Filed: Dec. 29, 2014

(86) PCT No.: PCT/CN2014/095363
§ 371 (c)(1),
(2) Date: Aug. 20, 2015

(87) PCT Pub. No.: WO2016/029612
PCT Pub. Date: Mar. 3, 2016

(65) Prior Publication Data
US 2016/0254287 A1    Sep. 1, 2016

(30) Foreign Application Priority Data

Aug. 28, 2014    (CN) .......................... 2014 1 0433176

(51) Int. Cl.
*H01L 21/31* (2006.01)
*H01L 23/58* (2006.01)
(Continued)

(52) U.S. Cl.
CPC ............ *H01L 27/124* (2013.01); *H01L 27/12* (2013.01); *H01L 27/1248* (2013.01);
(Continued)

(58) Field of Classification Search
CPC .................... H01L 27/124; H01L 29/42364
(Continued)

(56) References Cited

U.S. PATENT DOCUMENTS 6,528,357 B2 *   3/2003   Dojo ................... H01L 27/1214
                                                         438/151
2002/0139983 A1   10/2002  Choi et al.
(Continued)

FOREIGN PATENT DOCUMENTS

CN          2003031817 A       1/2003
CN             1573453 A       2/2005
(Continued)

OTHER PUBLICATIONS

Jun. 9, 2015—International Search Report Appn PCT/CN2014/095363 with Eng Tran of Written Opinion.

*Primary Examiner* — Calvin Lee
(74) *Attorney, Agent, or Firm* — Banner & Witcoff, Ltd.

(57) ABSTRACT

A thin-film transistor (TFT), a manufacturing method thereof, display substrate and a display device are disclosed. The TFT includes: an active layer, gate insulating layer, gate electrode, interlayer dielectric layer, source electrode and a drain electrode disposed on a base substrate in sequence. The source electrode and drain electrode are respectively connected with the active layer via a through hole exposing the active layer; the gate insulating layer at least includes a silicon oxide layer and a silicon nitride layer in a two-layer structure; the interlayer dielectric layer at least includes silicon oxide layers and silicon nitride layers in a four-layer structure; the silicon oxide layers and silicon nitride layers of the gate insulating layer and the interlayer dielectric layer are alternately arranged; and the dimension of one side of the through hole away from the base substrate is greater than that of one side close to the base substrate.

17 Claims, 4 Drawing Sheets

(51) Int. Cl.
  *H01L 27/12*   (2006.01)
  *H01L 29/786*  (2006.01)
  *H01L 29/06*   (2006.01)
  *H01L 29/423*  (2006.01)

(52) U.S. Cl.
  CPC ........ *H01L 29/06* (2013.01); *H01L 29/42364* (2013.01); *H01L 29/42384* (2013.01); *H01L 29/786* (2013.01)

(58) Field of Classification Search
  USPC ............... 438/763, 787, 791; 257/649, 640
  See application file for complete search history.

(56) References Cited

U.S. PATENT DOCUMENTS

| 2005/0287722 A1 | 12/2005 | Zhang |
| 2012/0199827 A1 | 8/2012 | Shibata et al. |

FOREIGN PATENT DOCUMENTS

| CN | 202189209 U | 4/2012 |
| CN | 103231570 A | 8/2013 |
| CN | 104218094 A | 12/2014 |
| CN | 204011436 U | 12/2014 |

* cited by examiner

US 9,589,991 B2

THIN-FILM TRANSISTOR, MANUFACTURING METHOD THEREOF, DISPLAY SUBSTRATE AND DISPLAY DEVICE

The application is a U.S. National Phase Entry of International Application No. PCT/CN2014/095363 filed on Dec. 29, 2014, designating the United States of America and claiming priority to Chinese Patent Application No. 201410433176.6 filed on Aug. 28, 2014. The present application claims priority to and the benefit of the above-identified applications and the above-identified applications are incorporated by reference herein in their entirety.

TECHNICAL FIELD

Embodiments of the present invention relate to a thin-film transistor (TFT), a manufacturing method thereof, a display substrate and a display device.

BACKGROUND

With the improvement of people's living standards, display equipments such as mobile phones, cameras, computers and televisions are widely applied by people. TFTs, as important elements of the equipments, directly affect the display effect of the display equipments. A TFT generally comprises an active layer, a gate insulating layer, a gate electrode, a source electrode and a drain electrode and is generally applied in, e.g., a liquid crystal display (LCD), an organic light-emitting diode (OLED) device and an e-paper display device and taken as a switching element or a drive element.

SUMMARY

At least one embodiment of the present invention provides a thin film transistor (TFT), a display substrate and a display device, which can solve the problem of wire breakage defect of subsequently formed electrodes in through holes.

At least one embodiment of the present invention provides a thin film transistor (TFT), which comprises: an active layer, a gate insulating layer, a gate electrode, an interlayer dielectric layer, a source electrode and a drain electrode disposed on a base substrate in sequence, the source electrode and the drain electrode being each connected with the active layer via a through hole exposing the active layer, both the gate insulating layer and the interlayer dielectric layer including silicon oxide layers and silicon nitride layers, the gate insulating layer at least including the silicon oxide layer and the silicon nitride layer in a two-layer structure, the interlayer dielectric layer at least including the silicon oxide layers and the silicon nitride layers in a four-layer structure, wherein all the silicon oxide layers and all the silicon nitride layers of the gate insulating layer and the interlayer dielectric layer are alternately arranged; and the compactness of at least odd-numbered or even-numbered layers in all the layers of the gate insulating layer and the interlayer dielectric layer is gradually increased as counted from the silicon oxide layer or the silicon nitride layer, farthest from the base substrate, in the interlayer dielectric layer.

At least one embodiment of the present invention provides a display substrate, which comprises the foresaid TFT.

At least one embodiment of the present invention provides a display device, which comprises the foresaid display substrate.

At least one embodiment of the present invention provides a method for manufacturing the foresaid TFT, which comprises: alternately depositing the silicon oxide layers and the silicon nitride layers on the base substrate in the process of respectively forming the gate insulating layer and the interlayer dielectric layer, and adjusting technological parameters so that compactness of at least odd-numbered layers or even-numbered layers in all the layers of the gate insulating layer and the interlayer dielectric layer is gradually increased as counted from the silicon oxide layer or the silicon nitride layer, farthest from the base substrate, in the interlayer dielectric layer.

BRIEF DESCRIPTION OF THE DRAWINGS

Simple description will be given below to the accompanying drawings of the embodiments to provide a more clear understanding of the technical proposals of the embodiments of the present invention. Obviously, the drawings described below only involve some embodiments of the present invention but are not intended to limit the present invention.

REFERENCE NUMERALS OF THE ACCOMPANYING DRAWINGS

10—Base Substrate; 20—Active Layer; 201—Source Region; 202—Drain Region; 203—Polysilicon Region; 30—Gate Insulating Layer; 301—Silicon Oxide Layer of Gate Insulating Layer; 302—Silicon Nitride Layer of Gate Insulating Layer; 303—First Silicon Oxide Layer; 304—First Silicon Nitride Layer; 305—Second Silicon Oxide Layer; 306—Second Silicon Nitride Layer; 40—Gate Electrode; 50—Interlayer Dielectric Layer; 53—Through Hole; 54—Second Through Hole; 55—Third Through Hole; 501—Silicon Oxide Layer of Interlayer Dielectric Layer; 502—Silicon Nitride Layer of Interlayer Dielectric Layer; 503—Third Silicon Oxide Layer; 504—Third Silicon Nitride Layer; 505—Fourth Silicon Oxide Layer; 506—Fourth Silicon Nitride Layer; 61—Source Electrode; 62—Drain Electrode; 70—Buffer Layer; 90—Pixel Electrode; 100—Common Electrode; 110—Anode; 120—Organic Material Function Layer; 130—Cathode.

DETAILED DESCRIPTION

For more clear understanding of the objectives, technical proposals and advantages of the embodiments of the present invention, clear and complete description will be given below to the technical proposals of the embodiments of the present invention with reference to the accompanying drawings of the embodiments of the present invention. Obviously, the preferred embodiments are only partial embodiments of the present invention but not all the embodiments. All the other embodiments obtained by those skilled in the art without creative efforts on the basis of the embodiments of the present invention illustrated shall fall within the scope of protection of the present invention.

Figure 1:
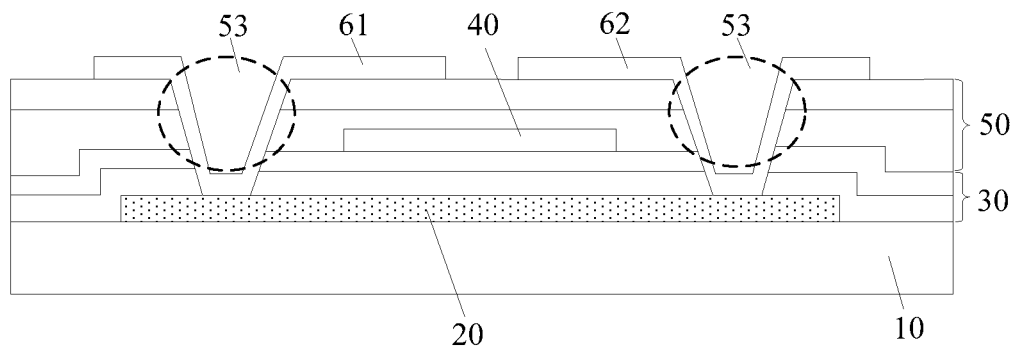
FIG. 1 is a schematic structural view of a thin film transistor (TFT)

As illustrated in FIG. 1, the thin film transistor (TFT) comprises: an active layer 20, a gate insulating layer 30, a gate electrode 40, an interlayer dielectric layer 50, a source electrode 61 and a drain electrode 62 disposed on a base substrate 10 in sequence. The source electrode 61 and the drain electrode 62 are each connected with the active layer 20 via a through hole 53 on the interlayer dielectric layer 50 and the gate insulating layer 30.

Figure 2:
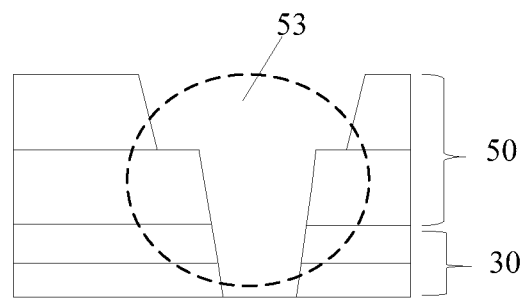
FIG. 2 is a schematic structural view of a through hole in FIG. 1.

As illustrated in FIG. 2, because the interlayer dielectric layer 50 includes one silicon oxide layer and one silicon nitride layer and the gate insulating layer 30 also includes one silicon oxide layer and one silicon nitride layer, the problem of large steps between the silicon oxide layers and the silicon nitride layers in the through hole 53 can be generated due to different etching rates of the two kinds of materials, namely the silicon oxide layer and the silicon nitride layer, of the interlayer dielectric layer 50 in the process of forming the through hole 53 by a dry etching process, and hence poor shape and unsmooth surface can be caused in the through hole 53. Therefore, a wire breakage defect tends to occur in the through hole 53 in the process of forming the source electrode 61 and the drain electrode 62 subsequently.

At least one embodiment of the present invention provides a TFT. As illustrated in FIGS. 3 to 7, the TFT comprises an active layer 20, a gate insulating layer 30, a gate electrode 40, an interlayer dielectric layer 50, a source electrode 61 and a drain electrode 62 disposed on a base substrate 10 in sequence. The source electrode 61 and the drain electrode 62 are each connected with the active layer 20 via a through hole 53 exposing the active layer 20; both the gate insulating layer 30 and the interlayer dielectric layer 50 include silicon oxide layers and silicon nitride layers; the gate insulating layer 30 includes at least the silicon oxide layer and the silicon nitride layer in a two-layer structure; and the interlayer dielectric layer 50 includes at least the silicon oxide layers and the silicon nitride layers in a four-layer structure.

All the silicon oxide layers and all the silicon nitride layers of the gate insulating layer 30 and the interlayer dielectric layer 50 are alternately arranged; and the compactness of at least odd-numbered layers or even-numbered layers in all the layers of the gate insulating layer 30 and the interlayer dielectric layer 50 is gradually increased as counted from the silicon oxide layer or the silicon nitride layer, that is farthest from the base substrate 10, in the interlayer dielectric layer 50.

It should be noted that the material of the active layer 20 is not limited in the embodiments of the present invention, and it may be amorphous silicon (a-Si), metal oxide, polysilicon or the like, and is not limited herein.

It should be understood by those skilled in the art that the overall thickness of, e.g., the gate insulating layer 30 in the TFT may be kept unchanged compared with the known technology. Similarly, compared with the known technology, the overall thickness of the interlayer dielectric layer 50 may be also kept unchanged.

The interlayer dielectric layer 50 is disposed between the gate electrode 40 and the source electrode 61 and the drain electrode 62 and has the function of isolating the gate electrode 40 from the source electrode 61 and the drain electrode 62, thus considering the manufacturing process and the cost, no other insulating layers are required to be formed between the gate electrode 40 and the source electrode 61 and the drain electrode 62 on the basis of forming the interlayer dielectric layer 50. Therefore, the gate insulating layer 30 and the interlayer dielectric layer 50 make contact with each other at other positions except the gate electrode 40.

For instance, the configuration that all the silicon oxide layers and all the silicon nitride layers of the gate insulating layer 30 and the interlayer dielectric layer 50 are alternately arranged includes: the silicon oxide layers and the silicon nitride layers of the gate insulating layer 30 are alternately arranged; the silicon oxide layers and the silicon nitride layers of the interlayer dielectric layer 50 are alternately arranged; and at the positions at which the gate insulating layer 30 and the interlayer dielectric layer 50 make contact with each other, the silicon oxide layer of the gate insulating layer 30 makes contact with the silicon nitride layer of the interlayer dielectric layer 50 or the silicon nitride layer of the gate insulating layer 30 makes contact with the silicon oxide layer of the interlayer dielectric layer 50.

The gate insulating layer 30 includes at least the silicon oxide layer and the silicon nitride layer in a two-layer structure; namely, the gate insulating layer 30 at least includes one silicon oxide layer and one silicon nitride layer. Similarly, the interlayer dielectric layer 50 includes at least the silicon oxide layers and the silicon nitride layers in a four-layer structure; namely, the interlayer dielectric layer 50 at least includes two silicon oxide layers and two silicon nitride layers.

As all the silicon oxide layers and all the silicon nitride layers of the gate insulating layer 30 and the interlayer dielectric layer 50 are alternately arranged, the compactness of at least odd-numbered layers or even-numbered layers in all the layers of the gate insulating layer 30 and the interlayer dielectric layer 50 is gradually increased as counted from the silicon oxide layer or the silicon nitride layer, that is farthest from the base substrate 10, in the interlayer dielectric layer 50.

Therefore, in the case that the layer, farthest from the base substrate 10, in the interlayer dielectric layer 50 is a silicon oxide layer, the compactness of all the silicon oxide layers of the gate insulating layer 30 and the interlayer dielectric layer 50 may be gradually increased from the top down (namely the compactness of the odd-numbered layers is gradually increased), and on this basis, for instance, the compactness of all the silicon oxide layers and all the silicon nitride layers of the gate insulating layer 30 and the interlayer dielectric layer 50 is gradually increased. Of course, the compactness of all the silicon nitride layers of the gate insulating layer 30 and the interlayer dielectric layer 50 may also be gradually increased (namely the compactness of the even-numbered layers is gradually increased), and on this basis, for instance, the compactness of all the silicon oxide layers and all the silicon nitride layers of the gate insulating layer 30 and the interlayer dielectric layer 50 is gradually increased.

Similarly, in the case that the layer, farthest from the base substrate 10, in the interlayer dielectric layer 50 is a silicon nitride layer, the compactness of all the silicon nitride layers of the gate insulating layer 30 and the interlayer dielectric layer 50 may be gradually increased from the top down (namely the compactness of the odd-numbered layers is gradually increased), and on this basis, for instance, the compactness of all the silicon nitride layers and all the silicon oxide layers of the gate insulating layer 30 and the interlayer dielectric layer 50 is gradually increased. Of course, the compactness of all the silicon oxide layers of the gate insulating layer 30 and the interlayer dielectric layer 50 may also be gradually increased (namely the compactness of the even-numbered layers is gradually increased), and on this basis, for instance, the compactness of all the silicon nitride layers and all the silicon oxide layers of the gate insulating layer 30 and the interlayer dielectric layer 50 is gradually increased.

No matter silicon oxide layers or silicon nitride layers, the higher the compactness, the slower the etching rate of corresponding layer in the process of forming the through hole. On this basis, for instance, when the compactness of the odd-numbered layers is gradually increased, the etching rate of the odd-numbered layer closer to the lower part is slower from the top down, and hence the etched hole of the odd-numbered layer closer to the lower part is smaller. On this basis, even the compactness of the even-numbered layer is lower than that of the odd-numbered layer which is disposed on and makes contact with the even-numbered layer, the formed through hole is funnel-shaped on the whole due to the small thickness of the layers, and hence the problem of wire breakage defect due to the shape of the through hole can be avoided.

Figure 3:
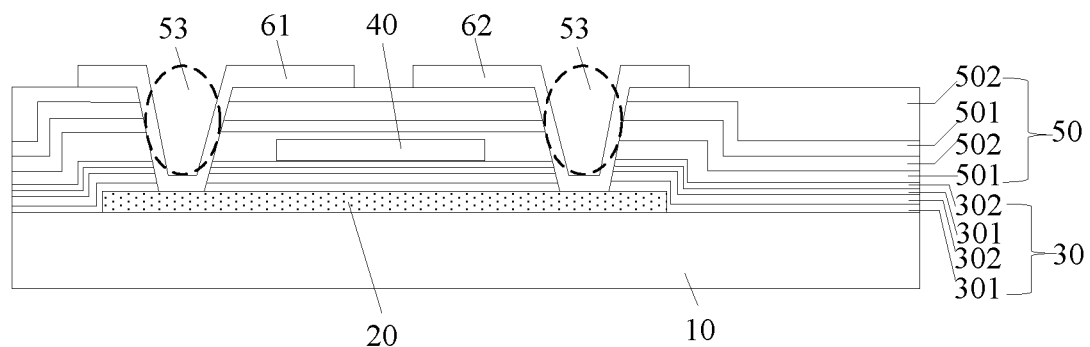
FIG. 3 is a schematic structural view of a TFT provided by the embodiment of the present invention.

Herein, all the silicon oxide layers and all the silicon nitride layers of the gate insulating layer 30 and the interlayer dielectric layer 50, for instance, may be deposited on the substrate one by one by a plasma enhanced chemical vapor deposition (PECVD) method, and the alternately deposited silicon nitride layers (e.g., the odd-numbered layers) and/or silicon oxide layers (e.g., the even-numbered layers) have different compactness. For instance, the compactness of thin films may be correspondingly adjusted according to the manufacturing technological parameters of the thin films. For instance, in the embodiment as shown in FIG. 3, in the gate insulating layer 30, the film-forming rate of the silicon oxide layer 301 is 500 to 1,000 Å/sec, and the film-forming rate of the silicon nitride layer 302 is 1,000 to 1,500 Å/sec; and in the interlayer dielectric layer 50, the film-forming rate of the silicon oxide layer 501 is 500 to 1,000 Å/sec, and the film-forming rate of the silicon nitride layer 502 is 1,000 to 1,500 Å/sec. Herein, the difference between the film-forming rate in rapid deposition and the film-forming rate in slow deposition is 200 to 500 Å/sec. However, it's only a preferred embodiment and the embodiment of the present invention is not limited thereto. For instance, the difference between the film-forming rate in rapid deposition and the film-forming rate in slow deposition may be 100 to 200 Å/sec. The difference may be specifically selected in other embodiments according to actual conditions, so no further description will be given here.

FIGS. 3 to 7 only illustratively indicates the number and the sequence of the silicon oxide layers and the silicon nitride layers of the gate insulating layer 30 and the interlayer dielectric layer 50. But the specific number of layers of the gate insulating layer 30 and the interlayer dielectric layer 50 is not limited in the embodiments of the present invention and may be set according to respective overall thickness. Of course, the sequence of the silicon oxide layers and the silicon nitride layers is also not limited in the embodiment of the present invention and may be determined by the specific etching rate.

Figure 4:
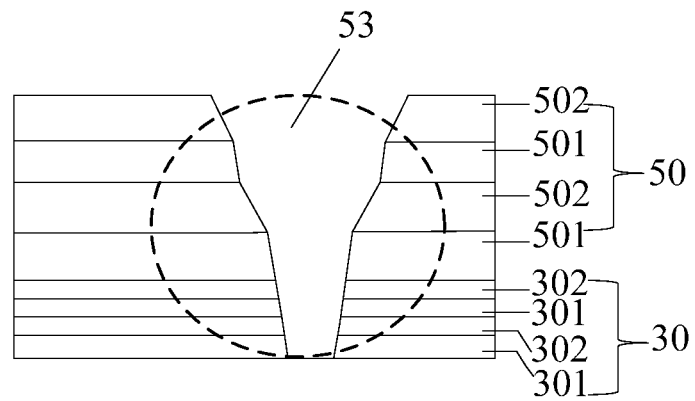
FIG. 4 is a schematic structural view of a through hole in FIG. 3.
Figure 5:
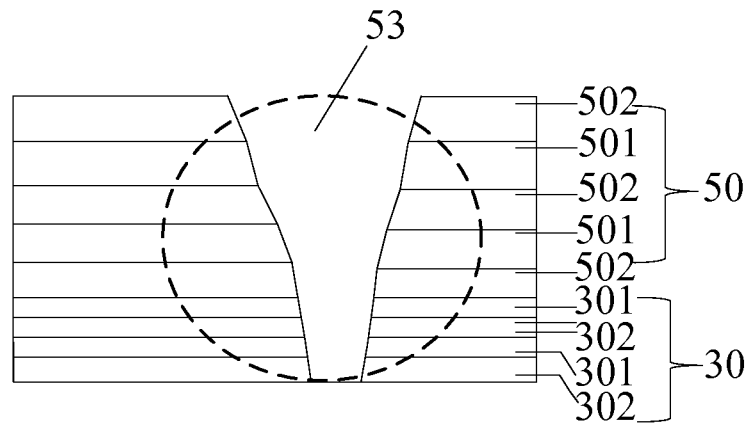
FIG. 5 is another schematic structural view of the through hole in FIG. 3.
Figure 6:
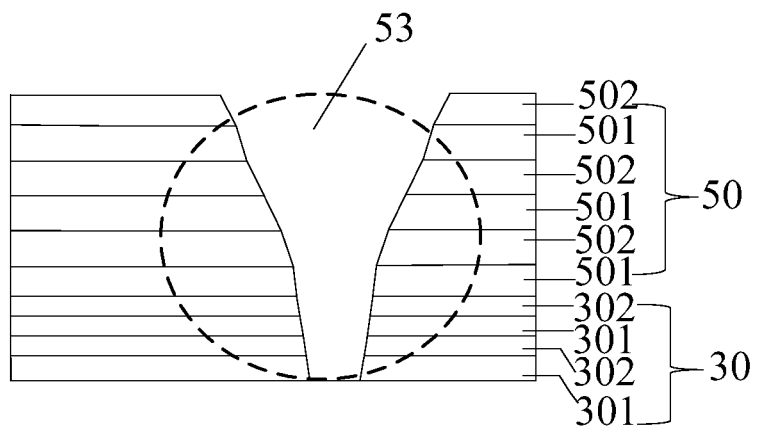
FIG. 6 is still another schematic structural view of the through hole in FIG. 3.

As for the problem of large steps between the silicon oxide layers and the silicon nitride layers in the through holes 53 caused by the phenomena that the silicon oxide layers and the silicon nitride layers of the interlayer dielectric layer have large thicknesses and different etching rates, in the embodiment of the present invention, the problem of wire breakage defect due to the shape of the through holes can be avoided by the setting of the compactness of the silicon oxide layers and/or the silicon nitride layers. Moreover, the thickness of each silicon oxide layer and each silicon nitride layer may be reduced in the case where the overall thickness of the interlayer dielectric layer 50 is unchanged, so that the number of the silicon oxide layers and the silicon nitride layers of the interlayer dielectric layer 50 can be increased; and all the silicon oxide layers and all the silicon nitride layers of the gate insulating layer 30 and the interlayer dielectric layer 50 are alternately arranged. Thus, in the process of forming the through holes 53 by etching the gate insulating layer 30 and the interlayer dielectric layer 50, even the etching rates of the silicon oxide layers and the silicon nitride layers are different, the steps between the silicon oxide layers and the silicon nitride layers will also be smaller in the process of forming the through hole 53 as shown in FIGS. 4 to 6 due to small thickness of the silicon oxide layers and the silicon nitride layers, so that the surface of the through hole 53 can be relatively smooth, and hence the problem of wire breakage defect of the subsequently formed electrodes in the through hole 53 can be alleviated. Moreover, the through hole 53 adopts the gradient etching method to avoid the overetching damage to the active layer 20.

For instance, as illustrated in FIGS. 4 to 6, the compactness of all the silicon oxide layers and all the silicon nitride layers of the gate insulating layer 30 and the interlayer dielectric layer 50 is gradually increased as counted from the silicon oxide layer or the silicon nitride layer, that is farthest from the base substrate 10, in the interlayer dielectric layer 50.

For instance, all the silicon oxide layers and all the silicon nitride layers of the gate insulating layer 30 and the interlayer dielectric layer 50, deposited in sequence, have gradually increased compactness from the top down.

Thus, in the process of forming the through hole 53 by etching, the surface of the through hole 53 may be smoother, and hence the problem of wire breakage defect can be further alleviated.

For instance, the overall thickness of the gate insulating layer is from 80 nm to 200 nm; and the overall thickness of the interlayer dielectric layer 50 is from 300 nm to 800 nm.

On this basis, for instance, the overall thickness of all the silicon oxide layers of the interlayer dielectric layer 50 is from 100 nm to 300 nm; the overall thickness of all the silicon nitride layers of the interlayer dielectric layer 50 is from 200 nm to 500 nm; and the interlayer dielectric layer 50 includes the silicon oxide layers and the silicon nitride layers in a four-layer or six-layer structure.

The example of the silicon oxide layers and the silicon nitride layers in the four-layer or six-layer structure of the interlayer dielectric layer 50 is described below.

The interlayer dielectric layer 50 may include the silicon oxide layers and the silicon nitride layers in a four-layer structure. For instance, as illustrated in FIG. 4, the interlayer dielectric layer 50 may include alternately arranged two silicon oxide layers 501 of the interlayer dielectric layer and alternately arranged two silicon nitride layers 502 of the interlayer dielectric layer; the thickness of each silicon oxide layer 501 of the interlayer dielectric layer may be from 50 nm to 150 nm; and the thickness of each silicon nitride layer 502 of the interlayer dielectric layer may be from 100 nm to 150 nm.

The interlayer dielectric layer 50 may include the silicon oxide layers and the silicon nitride layers in a five-layer structure. For instance, as illustrated in FIG. 5, the interlayer dielectric layer 50 may include alternately arranged two silicon oxide layers 501 of the interlayer dielectric layer and alternately arranged three silicon nitride layers 502 of the interlayer dielectric layer; the thickness of each silicon oxide layer 501 of the interlayer dielectric layer may be from 50 nm to 150 nm; and the thickness of each silicon nitride layer 502 of the interlayer dielectric layer may be from 70 nm to 170 nm.

The interlayer dielectric layer 50 may include the silicon oxide layers and the silicon nitride layers in a six-layer structure. For instance, as illustrated in FIG. 6, the interlayer dielectric layer 50 may include alternately arranged three silicon oxide layers 501 of the interlayer dielectric layer and alternately arranged three silicon nitride layers 502 of the interlayer dielectric layer; the thickness of each silicon oxide layer 501 of the interlayer dielectric layer may be from 40 nm to 100 nm; and the thickness of each silicon nitride layer 502 of the interlayer dielectric layer may be from 70 nm to 170 nm.

Thus, the steps in the through hole can be guaranteed to be smaller in the process of forming the through hole 53, and hence the problem of wire breakage defect of the subsequently formed source electrode 61 and drain electrode 62 in the through hole 53 can be alleviated. Moreover, the process of forming the interlayer dielectric layer 50 can be also reduced, and hence the cost can be saved.

For instance, the overall thickness of all the silicon oxide layers of the gate insulating layer 30 is from 40 nm to 100 nm; the overall thickness of all the silicon nitride layers of the gate insulating layer 30 is from 40 nm to 100 nm; and the gate insulating layer 30 may include the silicon oxide layers and the silicon nitride layers in a four-layer structure.

For instance, as illustrated in FIGS. 3 to 6, the gate insulating layer 30 may include alternately arranged two silicon oxide layers 301 of the gate insulating layer and alternately arranged two silicon nitride layers 302 of the gate insulating layer; the thickness of each silicon oxide layer 301 of the gate insulating layer may be from 20 nm to 50 nm; and the thickness of each silicon nitride layer 302 of the gate insulating layer may be from 20 nm to 50 nm.

Thus, the formed through hole 53 can be smoother, and hence the problem of wire breakage defect of the subsequently formed source electrode 61 and drain electrode 62 in the through hole 53 can be further improved.

Figure 7:
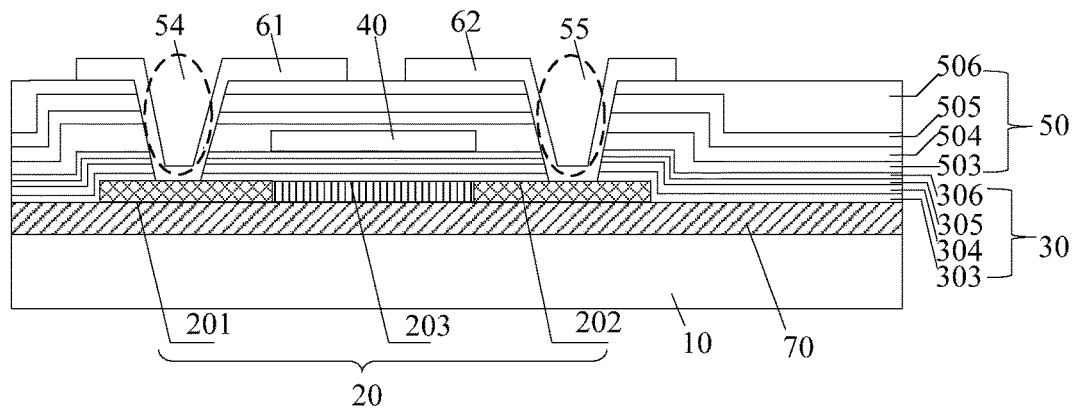
FIG. 7 is a schematic structural view of a low-temperature polysilicon TFT provided by the embodiment of the present invention.

Based on the above, for instance, as illustrated in FIG. 7, the active layer 20 includes a source region 201, a drain region 202 and a polysilicon region 203 disposed between the source region 201 and the drain region 202; based on this, the example of the connection between the source electrode 61 and the drain electrode 62 and the active layer 20 may be described below. The source electrode 61 is connected with the source region 201 via a second through hole 54 exposing the source region 201; and the drain electrode 62 is connected with the drain region 202 via a third through hole 55 exposing the drain region 202.

Herein, the source region 201 and the drain region 202 are formed by the ion implantation process of polysilicon in the region.

The step of forming a polysilicon film, for instance, may be as follows. One a-Si film is deposited at first by PECVD and subjected to a dehydrogenation process in a high-temperature oven so as to prevent the hydrogen detonation phenomenon in the crystallization process and reduce the defect density in the film after crystallization. After the completion of the dehydrogenation process, the low-temperature polysilicon process is performed; the a-Si film is subjected to crystallization by excimer laser annealer (ELA), metal induced crystallization (MIC), solid phase crystallization (SPC) or the like crystallization processes; and the polysilicon film is formed on the substrate. On this basis, the polysilicon film may be processed by a patterning process to form a polysilicon pattern in a specific region.

It can be known that the active layer 20 is set to include the source region 201, the drain region 202 and the polysilicon region 203, and the TFT provided by the embodiment of the present invention is applicable to a low-temperature polysilicon TFT; and if the TFT is applied in a display device, the display device may have the advantages of high resolution, rapid response speed, high brightness, high aperture opening ratio, etc.

On this basis, by considering that a general base substrate 10, e.g., a glass base substrate, contains specific detrimental impurities such as alkali metal ion impurities and the detrimental impurities may affect the performances of the active layer 20, as illustrated in FIG. 7, in the embodiment of the present invention, for instance, a buffer layer 70 is disposed between the base substrate 10 and the active layer 20 and allowed to make contact with the base substrate 10 to prevent the impurities in the base substrate 10 from being diffused into the active layer 20.

Detailed description will be given below to the TFT provided by an embodiment of the present invention with reference to a preferred embodiment. As illustrated in FIG. 7, the TFT comprises a buffer layer 70, an active layer 20, a gate insulating layer 30, a gate electrode 40, an interlayer dielectric layer 50, a source electrode 61 and a drain electrode 62 disposed on a base substrate 10 in sequence.

The active layer 20 includes a source region 201, a drain region 202 and a polysilicon region 203 disposed between the source region 201 and the drain region 202; the source electrode 61 is connected with the source region 201 via a second through hole 54 on the interlayer dielectric layer 50 and the gate insulating layer 30; and the drain electrode 62 is connected with the drain region 202 via a third through hole 55 on the interlayer dielectric layer 50 and the gate insulating layer 30.

The gate insulating layer 30 includes a first silicon oxide layer 303 close to the buffer layer 70 and a first silicon nitride layer 304, a second silicon oxide layer 305 and a second silicon nitride layer 306 disposed on the first silicon oxide layer 303 in sequence. The overall thickness of the first silicon oxide layer 303 and the second silicon oxide layer 305 is from 40 nm to 100 nm, and the overall thickness of the first silicon nitride layer 304 and the second silicon nitride layer 306 is from 40 nm to 100 nm.

The interlayer dielectric layer 50 includes a third silicon oxide layer 503 close to the second silicon nitride layer 306 and a third silicon nitride layer 504, a fourth silicon oxide layer 505 and a fourth silicon nitride layer 506 disposed on the third silicon oxide layer 503 in sequence, and the etching rate of the fourth silicon nitride layer 506 is greater than that of the fourth silicon oxide layer 505. The overall thickness of the third silicon oxide layer 503 and the fourth silicon oxide layer 505 is from 100 nm to 300 nm, and the overall thickness of the third silicon nitride layer 504 and the fourth silicon nitride layer 506 is from 200 nm to 500 nm.

The dimension of the second through hole 54 and the third through hole 55 in the layers is reduced gradually from the fourth silicon nitride layer 506 to the first silicon oxide layer 303 along the vertical direction of the base substrate 10.

It should be noted that the word "on" referred in the present disclosure is based on the sequence of formed layer structures; the layer structures formed previously are disposed in the lower part; and the layer structures formed subsequently are disposed in the upper part.

In at least one embodiment of the present invention, on one hand, as the provided TFT is a polysilicon TFT, the display device having high resolution, rapid response speed, high brightness and high aperture opening ration can be provided; on the other hand, the interlayer dielectric layer 50 in the TFT includes, for instance, two silicon oxide layers and two silicon nitride layers, so that the steps in the through holes can be guaranteed to be smaller in the process of forming the second through hole 54 and the third through hole 55, and hence the problem of wire breakage defect of the subsequently formed source electrode 61 and drain electrode 62 in the second through hole 54 and the third through hole 55 can be alleviated; moreover, the process of forming the interlayer dielectric layer 50 may be also reduced, and hence the cost can be saved; and as the gate insulating layer 30 includes two silicon oxide layers and two silicon nitride layers, the formed second through hole 54 and the formed third through hole 55 can be smoother, and hence the problem of wire breakage defect of the subsequently formed source electrode 61 and drain electrode 62 in the second through hole 54 and the third through hole 55 can be further improved. In addition, the second through hole 54 and the third through hole 55 adopts the gradient etching method to avoid the overetching damage to the active layer 20.

At least one embodiment of the present invention provides a display substrate, which comprises the foresaid TFT.

Figure 8:
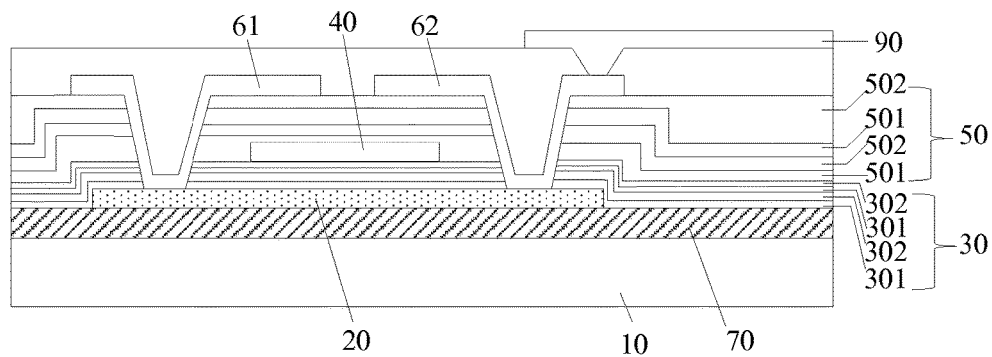
FIG. 8 is a schematic structural view of a display substrate provided by one embodiment of the present invention.

For instance, as illustrated in FIG. 8, the display substrate may be an active-matrix liquid crystal display (AMLCD) array substrate. Apart from the TFT, the display substrate further comprises pixel electrodes 90 electrically connected with the drain electrodes 62 of the TFTs.

Moreover, the display substrate may further comprise common electrodes.

Based on the above, the display device provided by at least one embodiment of the present invention may be applicable to the production of an advanced super dimension switch (ADS) LCD device. The key technical characteristics of the ADS technology are as follows: a multi-dimensional electric field is formed by electric fields produced at edges of slit electrodes in the same plane and electric fields produced between a slit electrode layer and a plate electrode layer, so that liquid crystal molecules in all the alignments between slit electrodes in a liquid crystal cell and over electrodes can rotate, and hence the working efficiency of the liquid crystals and the transmittance can be alleviated. The ADS technology can improve the image quality of thin-film transistor liquid crystal display (TFT-LCD) products and has the advantages of high resolution, high transmittance, low power consumption, wide viewing angle, high aperture opening ratio, low color difference, non Push Mura, etc.

Figure 9:
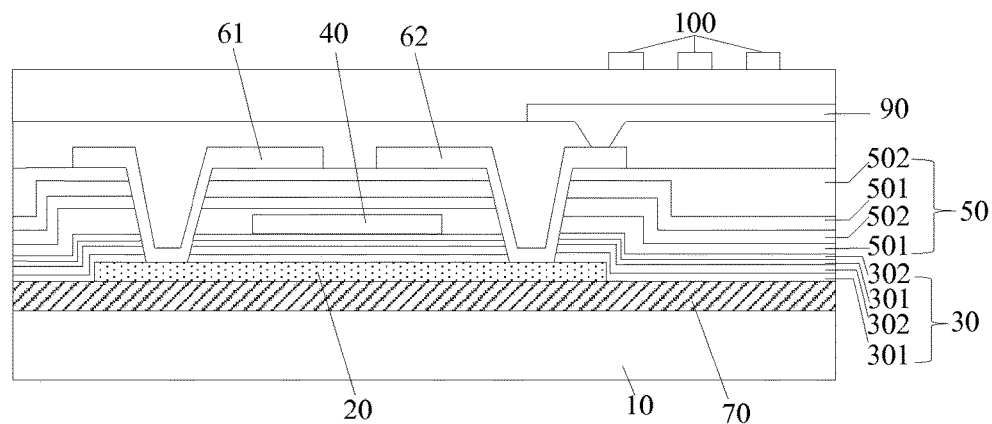
FIG. 9 is a schematic structural view of a display substrate provided by another embodiment of the present invention.

Therefore, as illustrated in FIG. 9, the common electrodes 100 are, for instance, disposed above the pixel electrode 90.

Figure 10:
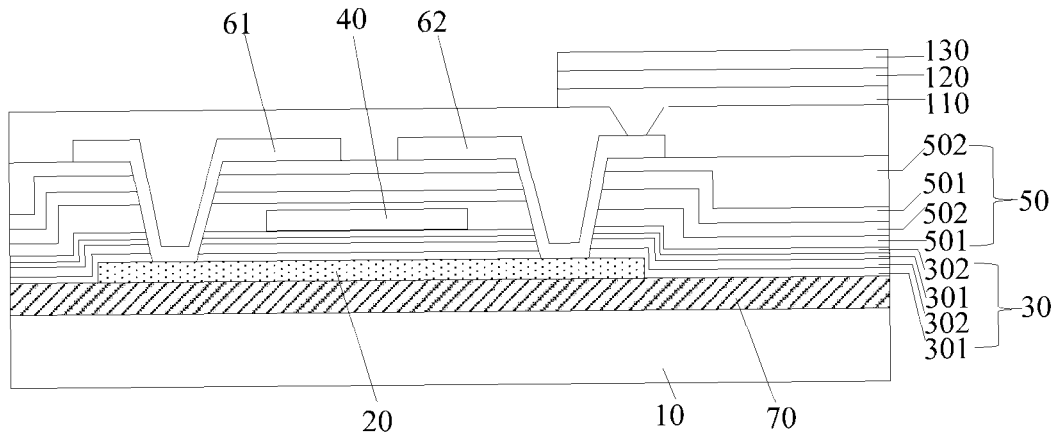
FIG. 10 is a schematic structural view of a display substrate provided by still another embodiment of the present invention.

For instance, as illustrated in FIG. 10, the display substrate may be an AMOLED array substrate. Besides the above-described TFT, the display substrate further comprises an anode 110 electrically connected with the drain electrode 62 of the TFT, a cathode 130 disposed on one side of the anode 110 away from the TFT, and an organic material function layer 120 disposed between the anode 110 and the cathode 130.

The organic material function layer 120 at least includes an emission layer (EML) and may further include an electron transport layer (ETL) and a hole transport layer (HTL). Moreover, in order to improve the efficiency of the injection of electrons and holes into the EML, the organic material function layer 120 may further include an electron injection layer (EIL) disposed between the cathode 130 and the ETL and a hole injection layer (HIL) disposed between the anode 110 and the HTL.

The display substrate can be divided into a single-sided emission type display substrate and a double-sided emission type display substrate according to different materials of the anode 110 and the cathode 130. That is to say, when the material of one electrode in the anode 110 and the cathode 130 is an opaque material, the display substrate is a single-sided emission type display substrate; and when the material of both the anode 110 and the cathode 130 is a transparent material, the display substrate is a double-sided emission type display substrate.

The single-sided emission type display substrate may be also divided into a top emission type and a bottom emission type according to different materials of the anode 110 and the cathode 130. When the anode 110 is close to the base substrate 10, the cathode 130 is away from the base substrate 10, the material of the anode 110 is a transparent conductive material, and the material of the cathode 130 is an opaque conductive material, because light is emitted from the anode 110 and the side of the base substrate 10, the display substrate may be referred to as a bottom emission type; and when the material of the anode 110 is an opaque conductive material and the material of the cathode 130 is a transparent conductive material, because light is emitted from the cathode 130 and one side opposite to the base substrate 10, the display substrate may be referred to as a top emission type.

As for the double-sided emission type display substrate, when the anode 110 is close to the base substrate 10, the cathode 130 is away from the base substrate 10, the materials of both the anode 110 and the cathode 130 are transparent conductive materials, e.g., indium tin oxide (ITO), because light is emitted from the anode 110 and the side of the base substrate 10 on one hand and emitted from the cathode 130 and one side opposite to the base substrate 10 on the other hand, the display substrate may be referred to as double-sided emission type.

At least one embodiment of the present invention provides a display device, which comprises any foresaid display substrate.

The display device may specifically be any product or component having display function such as a TV, a digital camera, a mobile phone, a tablet PC and a watch.

The foresaid is only the preferred embodiments of the present invention and not intended to limit the scope of protection of the present invention. The scope of protection of the present invention should be defined by the appended claims.

The application claims priority to the Chinese patent application No. 201410433176.6, filed on Aug. 28, 2014, the entire disclosure of which is incorporated herein by reference as part of the application.

The invention claimed is:

1. A method for manufacturing a thin-film transistor (TFT), the TFT comprising an active layer, a gate insulating layer, a gate electrode, an interlayer dielectric layer, a source electrode and a drain electrode disposed on a base substrate in sequence, the gate insulating layer at least comprising a silicon oxide layer and a silicon nitride layer in a two-layer structure, the interlayer dielectric layer at least comprising silicon oxide layers and silicon nitride layers in a four-layer structure, all the silicon oxide layers and all the silicon nitride layers of the gate insulating layer and the interlayer dielectric layer being alternately arranged, the manufacturing method comprising:
   alternately depositing the silicon oxide layers and the silicon nitride layers on the base substrate in a process of respectively forming the gate insulating layer and the interlayer dielectric layer, and
   adjusting technological parameters so that compactness of at least odd-numbered layers or even-numbered layers in all the layers of the gate insulating layer and the interlayer dielectric layer is gradually increased as counted from the silicon oxide layer or the silicon nitride layer, farthest from the base substrate, in the interlayer dielectric layer.

2. The manufacturing method according to claim 1, wherein the compactness of all the silicon oxide layers and all the silicon nitride layers of the gate insulating layer and the interlayer dielectric layer is gradually increased as counted from the silicon oxide layer or the silicon nitride layer, farthest from the base substrate, in the interlayer dielectric layer.

3. A thin-film transistor (TFT), comprising an active layer, a gate insulating layer, a gate electrode, an interlayer dielectric layer, a source electrode and a drain electrode disposed on a base substrate in sequence, the source electrode and the drain electrode being each connected with the active layer via a through hole exposing the active layer, both the gate insulating layer and the interlayer dielectric layer comprising silicon oxide layers and silicon nitride layers,
   wherein the gate insulating layer comprises at least the silicon oxide layer and the silicon nitride layer in a two-layer structure;
   the interlayer dielectric layer comprises at least the silicon oxide layers and the silicon nitride layers in a four-layer structure;
   the silicon oxide layers and the silicon nitride layers of the gate insulating layer and the interlayer dielectric layer are alternately arranged; and
   compactness of at least odd-numbered or even-numbered layers in all the layers of the gate insulating layer and the interlayer dielectric layer is gradually increased as counted from the silicon oxide layer or the silicon nitride layer, that is farthest from the base substrate, in the interlayer dielectric layer.

4. The TFT according to claim 3, wherein the active layer comprises a source region, a drain region and a polysilicon region disposed between the source region and the drain region,
   the source electrode and the drain electrode are respectively connected with the active layer via the through hole exposing the active layer,
   the source electrode is connected with the source region via a second through hole exposing the source region, and
   the drain electrode is connected with the drain region via a third through hole exposing the drain region.

5. The TFT according to claim 3, wherein the compactness of all the silicon oxide layers and all the silicon nitride layers of the gate insulating layer and the interlayer dielectric layer is gradually increased as counted from the silicon oxide layer or the silicon nitride layer, that is farthest from the base substrate, in the interlayer dielectric layer.

6. The TFT according to claim 5, wherein the active layer comprises a source region, a drain region and a polysilicon region disposed between the source region and the drain region,
   the source electrode and the drain electrode are respectively connected with the active layer via the through hole exposing the active layer,
   the source electrode is connected with the source region via a second through hole exposing the source region, and
   the drain electrode is connected with the drain region via a third through hole exposing the drain region.

7. The TFT according to claim 5, wherein an overall thickness of all the silicon oxide layers of the interlayer dielectric layer is from 100 nm to 300 nm;
   an overall thickness of all the silicon nitride layers of the interlayer dielectric layer is from 200 nm to 500 nm; and
   the interlayer dielectric layer comprises the silicon oxide layers and the silicon nitride layers in a four-layer or six-layer structure.

8. The TFT according to claim 7, wherein the overall thickness of all the silicon oxide layers of the gate insulating layer is from 40 nm to 100 nm;
   the overall thickness of all the silicon nitride layers of the gate insulating layer is from 40 nm to 100 nm; and
   the gate insulating layer comprises the silicon oxide layers and the silicon nitride layers in a four-layer structure.

9. The TFT according to claim 3, wherein an overall thickness of all the silicon oxide layers of the interlayer dielectric layer is from 100 nm to 300 nm;
   an overall thickness of all the silicon nitride layers of the interlayer dielectric layer is from 200 nm to 500 nm; and
   the interlayer dielectric layer comprises the silicon oxide layers and the silicon nitride layers in a four-layer or six-layer structure.

10. The TFT according to claim 9, wherein the active layer comprises a source region, a drain region and a polysilicon region disposed between the source region and the drain region,
   the source electrode and the drain electrode are respectively connected with the active layer via the through hole exposing the active layer,
   the source electrode is connected with the source region via a second through hole exposing the source region, and
   the drain electrode is connected with the drain region via a third through hole exposing the drain region.

11. The TFT according to claim 9, wherein the overall thickness of all the silicon oxide layers of the gate insulating layer is from 40 nm to 100 nm;
   the overall thickness of all the silicon nitride layers of the gate insulating layer is from 40 nm to 100 nm; and
   the gate insulating layer comprises the silicon oxide layers and the silicon nitride layers in a four-layer structure.

12. The TFT according to claim 11, wherein the active layer comprises a source region, a drain region and a polysilicon region disposed between the source region and the drain region, the source electrode and the drain electrode are respectively connected with the active layer via the through hole exposing the active layer, the source electrode is connected with the source region via a second through hole exposing the source region, and the drain electrode is connected with the drain region via a third through hole exposing the drain region.

13. A display substrate, comprising the thin-film transistor (TFT) according to claim 1.

14. The display substrate according to claim 13, further comprising an anode electrically connected with the drain electrode, a cathode disposed on a side, of the anode, away from the TFT, and an organic material function layer disposed between the anode and the cathode.

15. A display device, comprising the display substrate according to claim 13.

16. The display substrate according to claim 13, further comprising a pixel electrode electrically connected with the drain electrode.

17. The display substrate according to claim 16, further comprising a common electrode.

* * * * *